United States Patent
Xiao et al.

(10) Patent No.: US 8,268,545 B2
(45) Date of Patent: Sep. 18, 2012

(54) FORMATION OF A DEVICE USING BLOCK COPOLYMER LITHOGRAPHY

(75) Inventors: Shuaigang Xiao, Cranberry Township, PA (US); Xiaomin Yang, Sewickley, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 921 days.

(21) Appl. No.: 12/135,387

(22) Filed: Jun. 9, 2008

(65) Prior Publication Data

US 2009/0305173 A1  Dec. 10, 2009

(51) Int. Cl.
*G03F 7/26* (2006.01)

(52) U.S. Cl. ........................................................ 430/324

(58) Field of Classification Search ................... 430/322, 430/324
See application file for complete search history.

(56) References Cited

U.S. PATENT DOCUMENTS

| | | | |
|---|---|---|---|
| 5,587,223 A | 12/1996 | White | |
| 5,956,216 A | 9/1999 | Chou | |
| 6,162,532 A | 12/2000 | Black et al. | |
| 6,926,953 B2 | 8/2005 | Nealey et al. | |
| 7,115,208 B2 | 10/2006 | Hieda et al. | |
| 2008/0102252 A1* | 5/2008 | Black et al. | 428/173 |
| 2008/0233323 A1* | 9/2008 | Cheng et al. | 428/36.91 |
| 2009/0087664 A1* | 4/2009 | Nealey et al. | 428/411.1 |

OTHER PUBLICATIONS

S. Xiao et al., "Graphoepitaxial Cylindrical Block Copolymer Nanodomains Evaluated As Bit Patterned Media Template", J. Vac. Sci. Technol. B 25(6), Nov./Dec. 2007, pp. 1953-1957, 2007 American Vacuum Society.

* cited by examiner

*Primary Examiner* — Brittany Raymond
(74) *Attorney, Agent, or Firm* — Mueting Raasch & Gebhardt PA

(57) ABSTRACT

The formation of a device using block copolymer lithography is provided. The formation of the device includes forming a block copolymer structure. The block copolymer structure includes a first polymer and a second polymer. The block copolymer structure also includes a first component deposited between adjacent blocks of the first polymer and a second component deposited between adjacent blocks of the second polymer. A template is developed by removing either the first and second polymers or the first and second components from the block copolymer structure. The formation of the device also includes lithographically patterning the device utilizing the block copolymer structure template. The device may be a data storage medium.

18 Claims, 5 Drawing Sheets

FORMATION OF A DEVICE USING BLOCK COPOLYMER LITHOGRAPHY

BACKGROUND

A block copolymer consists of two or more polymeric chains (blocks), which are chemically different and covalently attached to each other. Block copolymers are being suggested for many applications based primarily on their ability to form nanometer scale patterns. These self-assembled patterns are being considered as nanolithographic masks as well as templates for the further synthesis of inorganic or organic structures. Such applications are made possible by taking advantage of contrasts in chemical or physical properties that lead to differential etch rates or attractions to new materials. New applications in, for example, fuel cells, batteries, data storage and optoelectronic devices generally rely on the inherent properties of the blocks. All of these uses depend on the regular self-assembly of block copolymers over macroscopic distances.

Block copolymer thin films are of particular interest because of the possibility of obtaining multi-dimensional patterns with very high registry and regularity. In particular, they provide access to a length scale that is not available to traditional lithographic techniques. One focus has been on the patterning of microelectronics components on a length scale inaccessible by optical lithography. Many device structures are simply miniaturized versions of current electronics. For instance, high density hard drives can be made by using the polymer nanodomains to pattern magnetic bits with a significantly greater number of bits per unit area than the current optical lithographically patterned drives.

Traditional microelectronics fabrication has relied on approaches involving the direct patterning of subsequent layers. Trends to smaller feature sizes, as exemplified by Moore's law, with inherently decreased diffusion distances and increased surface/volume ratios are rapidly approaching the limits of traditional optical lithography. While several alternatives have been introduced, many are prohibitively expensive. Self-assembled block copolymers as lithographic masks offer a potentially inexpensive alternative. In this case, the block copolymer thin film is used to transfer a dense set of nanoscale patterns into the desired material. The goal is generally to achieve highly uniform structures with high aspect ratios for application in a variety of devices from biochips to quantum dot arrays to transistors.

In the thin film state, the block copolymer nanodomain formation takes place relative to the surfaces of the film. The nanodomains tend to form with a particular orientation to the substrate surface. In the case of shapes with a long axis (e.g. cylinders and lamellae), the orientation of the long axis with the surface is a major characteristic of the film. Cylinders lying parallel to the surface and lamellae standing perpendicular may each be of interest in the patterning of nanowires. Upright cylinders, lamellae and spheres may be of interest in the patterning of arrays for use, for example, in data storage.

SUMMARY

An aspect of the present invention is to provide a method of forming a data storage medium that includes providing a substrate, depositing a block copolymer structure on the substrate, developing a template, and lithographically patterning the data storage medium utilizing the template. The block copolymer structure includes a first polymer and a second polymer. The block copolymer structure also includes a first component deposited between adjacent blocks of the first polymer and a second component deposited between adjacent blocks of the second polymer. The template is developed by removing either the first and second polymers or the first and second components from the block copolymer structure. The method also includes lithographically patterning the data storage medium utilizing the template.

Another aspect of the present invention is to provide a method that includes providing a substrate and forming a block copolymer structure on the substrate. The block copolymer structure includes a plurality of first polymer blocks, a plurality of second polymer blocks, a first component block, and a second component block wherein the first component block is positioned between adjacent first polymer blocks and the second component block is positioned between adjacent second polymer blocks. The method also includes removing either the pluralities of first and second polymer blocks or removing the first and second component blocks from the block copolymer structure to form a template. The method further includes utilizing the template to form a device. In accordance with an aspect of the invention, the device may be a data storage medium.

These and various other features and advantages will be apparent from a reading of the following detailed description.

DRAWINGS

DETAILED DESCRIPTION

Figure 1:
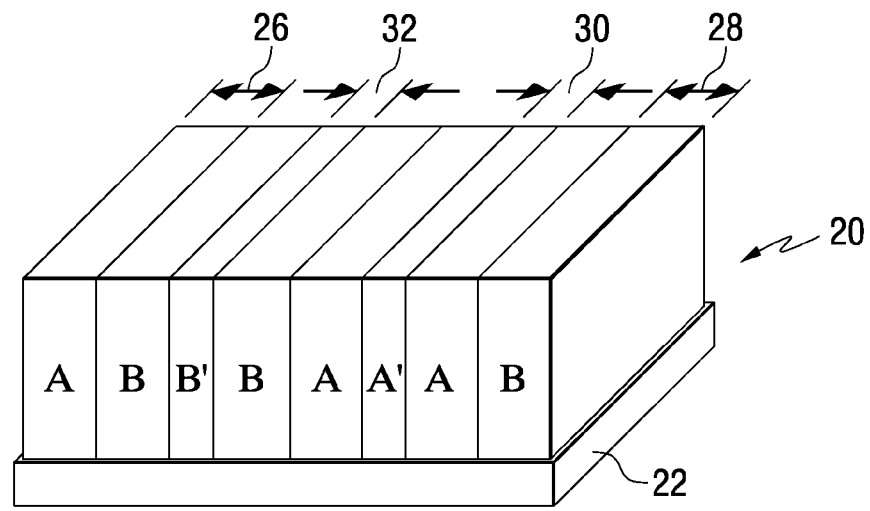
FIG. 1 illustrates a block copolymer structure, according to one aspect of the invention.

FIG. 1 illustrates a block copolymer structure 20, in accordance with an aspect of the invention. The block copolymer structure 20 includes a substrate 22. The substrate 22 may be formed of, for example, silicon, silicon oxide, aluminum, alumina, and other metals and metal oxides with or without surface pretreatment by self-assembled organosilicate monolayers or polymer brushes, which enable perpendicularly orientation of block copolymer nanostructures and simultaneous wetting of both blocks in the copolymer to the substrate surface. In addition, it will be appreciated that the substrate 22 may include multiple layers. The substrate 22 may include one or more mask layers for use in lithography patterning processes. The substrate 22 may also include device material layers, e.g. magnetic material layers for forming data storage layers.

As shown in FIG. 1, the block copolymer structure 20 includes a plurality of first polymer blocks generally designated by the letter "A". The block copolymer structure 20 also includes a plurality of second polymer blocks, generally designated by the letter "B". The blocks A and B are chemically different and covalently attached to each other. The block copolymer structure 20 may contain any number of the polymer block components A and B. The block copolymer structure 20 can have either a linear or a branched structure. In accordance with one aspect of the invention, the block copolymer structure is a linear diblock copolymer having the formula of A-B.

The first polymer block A may be, for example, polystyrene, polymethylmethacrylate, polyethyleneoxide, polyisoprene, polybutadiene, polylactide, polyvinylpyridine, or other similar types of polymers. The first polymer block B may be, for example, polystyrene, polymethylmethacrylate, polyethyleneoxide, polyisoprene, polybutadiene, polylactide, polyvinylpyridine, or other similar types of polymers. It will be appreciated that the blocks A and B are different polymers such that the blocks are immiscible. For example, the first polymer block A could be polystyrene (PS) and the second polymer block B could be polymethylmethacrylate (PMMA) to provide a polymer block structure at the interface of blocks A and B of polystyrene-b-polymethylmethacrylate (PS-b-PMMA). Various other combinations of polymers can be used in accordance with the invention.

Figure 6:
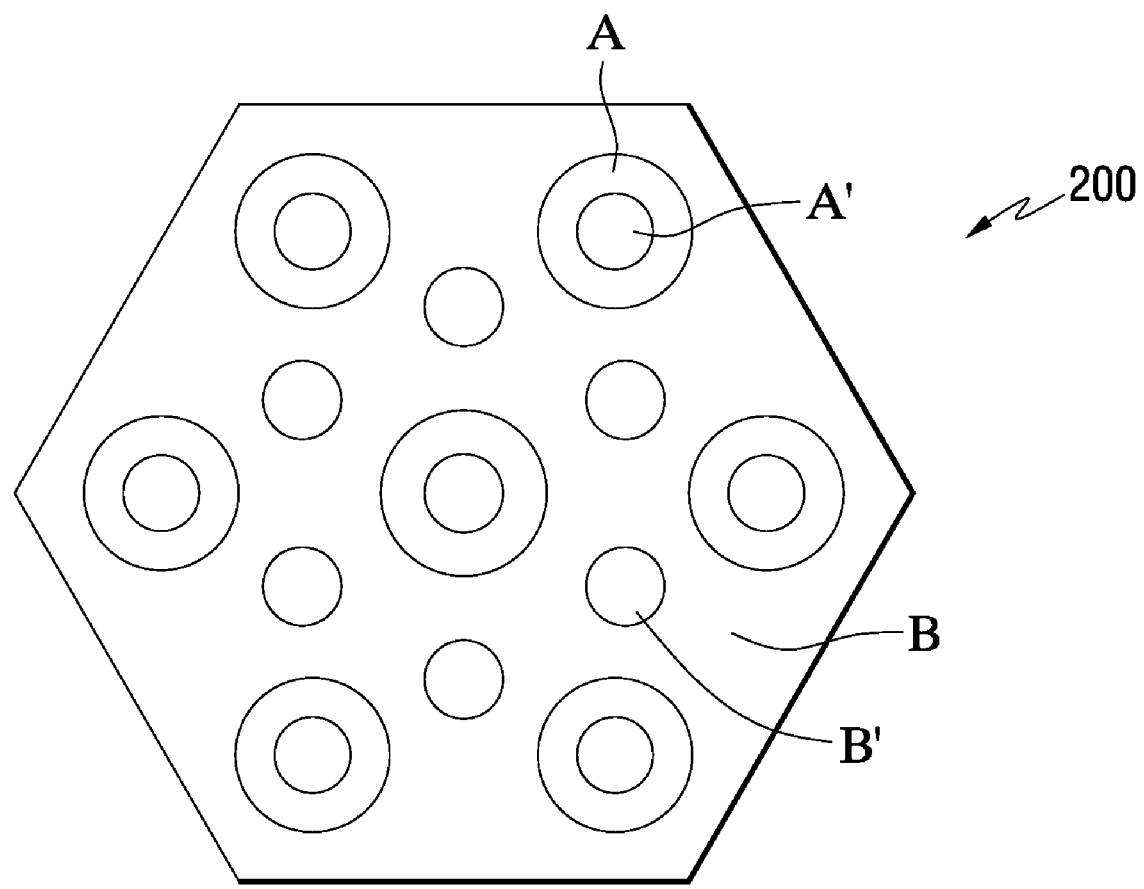
FIG. 6 illustrates a top view of a block copolymer structure, according to one aspect of the invention.

Still referring to FIG. 1, the first polymer blocks A and the second polymer blocks B are formed to have a lamellae shape. However, the polymer blocks A and B may have other shapes such as, for example, a cylindrical shape as illustrated in FIG. 6. For the block copolymer structure 20 illustrated in FIG. 1, the lamellae shaped first polymer block A may have a thickness 26 in the range of about 3 nm to about 100 nm The second polymer block B may have a thickness 28 in the range of about 3 nm to about 100 nm.

As shown in FIG. 1, the block copolymer structure 20 also includes a first component, generally designated by letter "A'", that is positioned adjacent to or between blocks of the first polymer block A. The block copolymer structure 20 also includes a second component generally designated by letter "B'", that is positioned adjacent to or between blocks of the second polymer blocks B. It will be appreciated that the block copolymer structure 20 as shown in FIG. 1 can be continually repeated as many times as desired. In addition, it will be appreciated that additional polymer blocks and respective components positioned adjacent thereto or therebetween can be provided in accordance with the invention to form various block copolymer structures.

The first component A' is chosen to have a similar or compatible chemical structure as the first polymer blocks A. Similarly, the second component B' is chosen to have a similar or compatible chemical structure as the second polymer blocks B. For example, the first component A' and the second component B' can be a homopolymer, a block copolymer or an organosilicate. Homopolymers that can be used as components A' and B' include, for example, polyethyleneoxide, polyisoprene, polybutadiene, polylactide, polyvinylpyridine, or many other kinds of polymers. Block copolymers that can be used as components A' and B' include, for example, polystyrene-b-polydimethylsiloxane, polystyrene-b-polydimethylsiloxane, polyethyleneoxide-b-polydimethylsiloxane, polystyrene-b-polydimethylsiloxane-b-polystyrene, polymethylmethacrylate-b-polydimethylsiloxane-b-polymethylmethacrylate, polyethyleneoxide-b-polydimethylsiloxane-polyethyleneoxide, or any hybrid di-/tri-block copolymers containing one or two organic polymer blocks and one or two inorganic polymer blocks providing sufficient chemical/compositional contrast for following pattern transfer.

The block copolymer structure 20 illustrated in FIG. 1 can be formed by depositing the first polymer blocks A, the second polymer blocks B, the first component A', and the second components B' on the substrate 22. In general, prior to the spin coating of the block copolymer films, all the polymers/components are mixed together in solutions. After the formation of a homogeneous solution, the solution is spin coated on a substrate pretreated with, for example, organosilicate monolayers or polymer brushes providing essentially identical surface tensions to both polymer blocks in the copolymer. All the polymer blocks and added components will form perpendicularly oriented lamellae or cylindrical nanostructures on the substrate due to balanced polymer/substrate and polymer/air interactions and proper film thickness confinement.

For the block copolymer structure 20 illustrated in FIG. 1, the first component A' may have a thickness 30 in the range of about 1 nm to about 50 nm. The second component B' may have a thickness 32 in the range of about 1 nm to about 50 nm.

Figure 2:
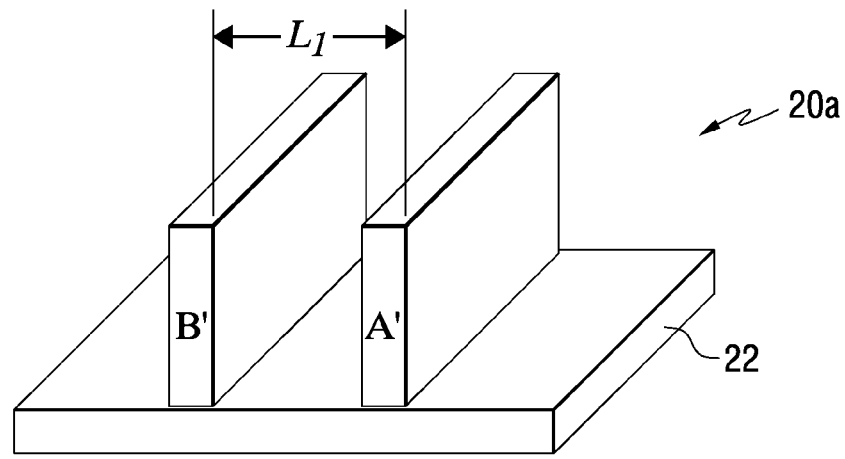
FIG. 2 illustrates a block copolymer template, according to one aspect of the invention.

FIG. 2 illustrates a template 20a that is formed from the block copolymer structure 20. The template 20a provides a template that may be used, for example, for additive or subtractive lithographic pattern transfer operations. The template 20a may be used for forming various devices such as, for example, data storage media, flash memory devices, semiconductor capacitors, nanowires, quantum dots, photonic crystals, or nanopores.

Still referring to FIG. 2, the template 20a is formed by removing the first polymer blocks A and the second polymer blocks B from the block copolymer structure 20 and leaving a domain structure that includes the first component A' and the second component B' as originally deposited on the substrate 22. As an example, when the components A' and B' are formed of hybrid organic-inorganic polymeric structures, the organic polymer blocks A and B can be removed by an oxygen plasma etch, leaving the inorganic nanostructures that include components A' and B' with organic parts inside also partially removed.

As shown in FIG. 2, the template 20a has a domain period $L_1$. The domain period $L_1$ may be in the range of about 5 nm to about 200 nm. The domain period shown, for example, in FIG. 2 is generally defined as the period of an A-B-B-A bilayer lamellar structure.

Figure 3:
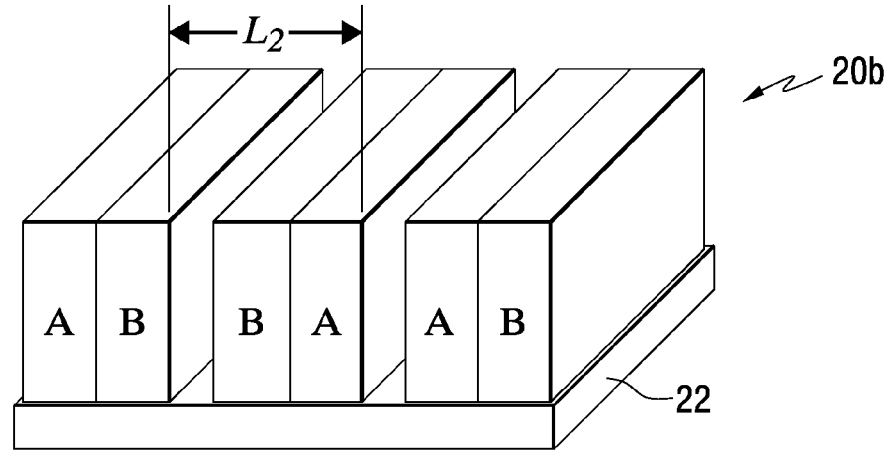
FIG. 3 illustrates a block copolymer template, according to one aspect of the invention.

Referring to FIG. 3, there is illustrated an additional template 20b formed in accordance with an aspect of the invention. The template 20b is formed by removing the first component A' and the second component B' from the block copolymer structure 20 and leaving a domain structure that includes the first polymer blocks A and the second polymer blocks B. The template 20b has a domain period $L_2$ in the range of about 5 nm to about 200 nm. The template 20b is formed similar to the template 20a shown in FIG. 2 except that the first component A' and second component B' are targeted for removal to establish a template with the domain structure shown in FIG. 3.

In accordance with an aspect of the invention, a "negative-tone" template such as shown in FIG. 2 may be used as the mask for a subtractive pattern transfer process, such as, for example, ion-beam etching (IBE) or reactive-ion etching (RIE) into underlying magnetic or hard mask materials. In accordance with another aspect of the invention, a "positive-tone" template such as shown in FIG. 3 may be used as the mask for an additive pattern transfer process, such as, for example, electroplating of magnetic or metallic hard mask materials.

Figure 4A:
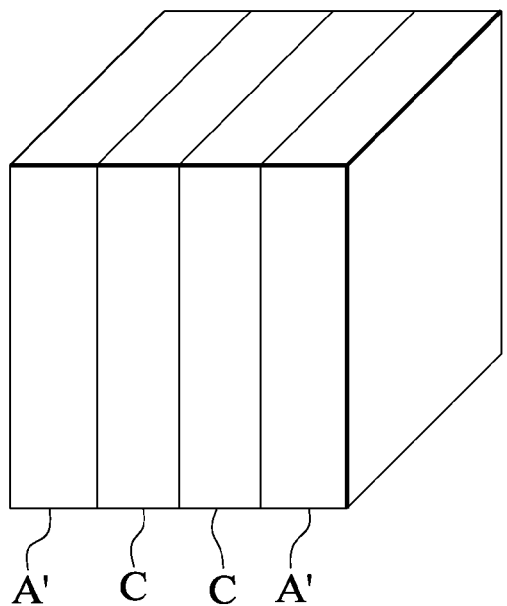
FIG. 4a illustrates a diblock copolymer structure, according to one aspect of the invention.
Figure 4B:
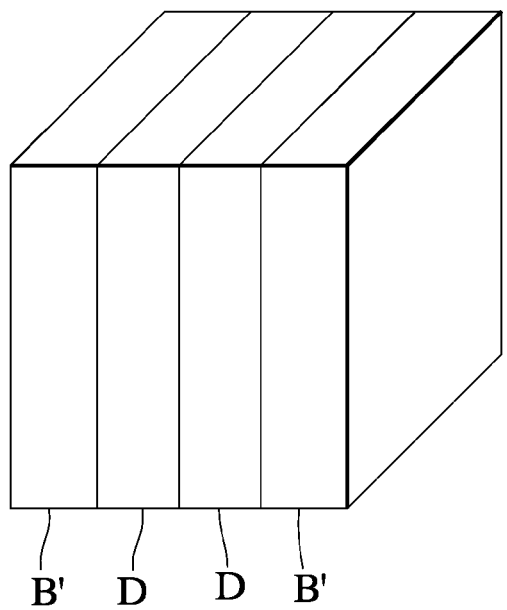
FIG. 4b illustrates a triblock copolymer structure, according to one aspect of the invention.
Figure 5A:
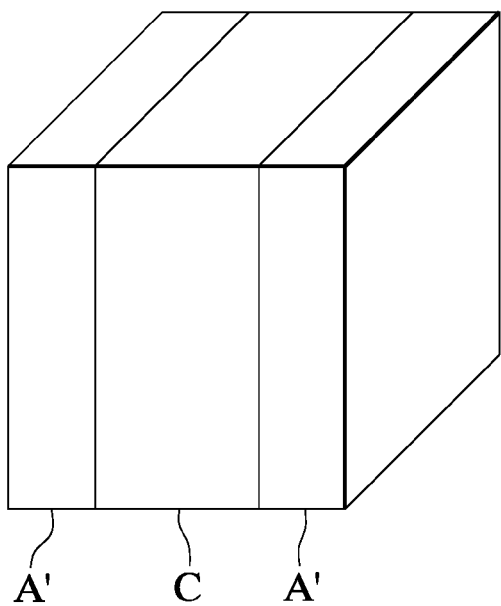
FIG. 5a illustrates a diblock copolymer structure, according to one aspect of the invention.
Figure 5B:
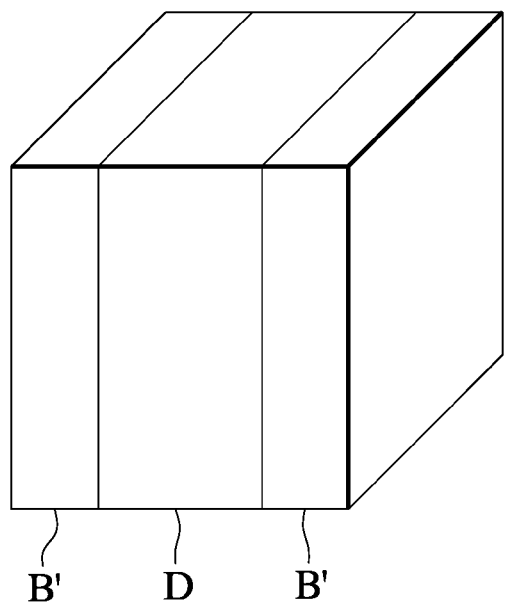
FIG. 5b illustrates a triblock copolymer structure, according to one aspect of the invention.

As described herein, the first component A' and the second component B' can be formed of a homopolymer or a block copolymer. In accordance with an additional aspect of the invention, the first component and the second component can be a diblock copolymer structure or a triblock copolymer structure. For example, the diblock copolymer structure illustrated in FIG. 4a could be substituted for the first component A' in the block copolymer structure 20 and the diblock copolymer structure illustrated in FIG. 4b could be substituted for the second component B' in the block copolymer structure 20. In other words, rather than having a single layer of the first component A', the diblock copolymer structure illustrated in FIG. 4a comprising two layers of the component A' and two layers of an additional component C therebetween could be used in place thereof (e.g. A'-C C-A'). Similarly, the diblock copolymer structure illustrated in FIG. 4b comprising two layers of the component B' and two layers of an additional component D therebetween (e.g. B'-D D-B') could be used in place of the single layer of the second component B'. Alternatively, the triblock copolymer structure shown in FIG. 5a could be used in place of the first component A' of the block copolymer structure 20 wherein the triblock copolymer structure includes two layers of the first component A' having a single layer of component C therebetween (e.g. A'-C-A'). Similarly, the triblock copolymer structure shown in FIG. 5b could be used in place of the second component B' of the block copolymer structure 20 wherein the triblock copolymer structure includes two layers of the second component B' having a single layer of component D therebetween (e.g. B'-D-B'). An advantage of using either the diblock or triblock copolymer structures is that there is greater flexibility to select the components C and D. For example, the components C and D can be either an organic or inorganic material, or could be a magnetic material. Another advantage of using the diblock or triblock copolymer structures is that if the chemical distinction between the component C and the first polymer block A or the component D and the second copolymer block B is large enough, then it is possible to achieve much smaller domain structures with much higher density due to the increase of interaction parameter between the blocks A and B. The added diblock copolymers (A'-C C-A', B'-D-D-B') or triblock copolymers (A'-C-A', B'-D-B') will locate between neighboring polymer blocks A or neighboring blocks B due to chemical similarity, to form alternative structures of (A-B)-(B'-D-D-B')-(B-A)-(A'-C-C-A')-(A-B) for diblock copolymer component additives, and (A-B)-(B'-D-B')-(B-A)-(A'-C-A')-(A-B) for triblock copolymer component additives.

The additional components C and D used in the diblock and triblock copolymer structures of FIGS. 4a, 4b and FIGS. 5a and 5b, respectively, can be, for example, polydimethylsiloxane, polyferrocenyldimethylsilane, and any polymers containing organic or inorganic, metallic or non-metallic, magnetic or non-magnetic compositions, providing sufficient chemical or functional contrast to polymer blocks.

FIG. 6 illustrates a top view of a block copolymer structure 200, in accordance with another aspect of the invention. The block copolymer structure 200 is similar to the block copolymer structure 20 illustrated in FIG. 1, but the structure 200 has a plurality of cylindrical blocks instead of the lamellae shaped blocks shown in FIG. 1. Specifically, the block copolymer structure 200 includes a plurality of first polymer blocks generally designated by the letter "A". The block copolymer structure 200 also includes a plurality of second polymer blocks, generally designated by the letter "B". The block copolymer structure 200 also includes a first component, generally designated by letter "A'", that is positioned adjacent to or between blocks of the first polymer block A. The block copolymer structure 200 also includes a second component generally designated by letter "B'", that is positioned adjacent to or between blocks of the second polymer blocks B. It will be appreciated that the block copolymer structure 200 as shown in FIG. 6 can be continually repeated as many times as desired. In addition, it will be appreciated that additional polymer blocks and respective components positioned adjacent thereto or therebetween can be provided in accordance with the invention to form various block copolymer structures.

Still referring to FIG. 6, the blocks A and B and the components A' and B' that comprise the structure 200 can be formed similar to the blocks and components described herein for structure 20 and the same materials can be utilized. In addition, the structure 200 can be used to form a template similar to how the structure 20 can be used to form a template as described herein. For example, the template may be formed by removing the first polymer blocks A and the second polymer blocks B from the block copolymer structure 200 and leaving a domain structure that includes the first component A' and the second component B'. Alternatively, a template may be formed by removing the first component A' and the second component B' from the block copolymer structure 200 and leaving a domain structure that includes the first polymer blocks A and the second polymer blocks B.

Figure 7A:
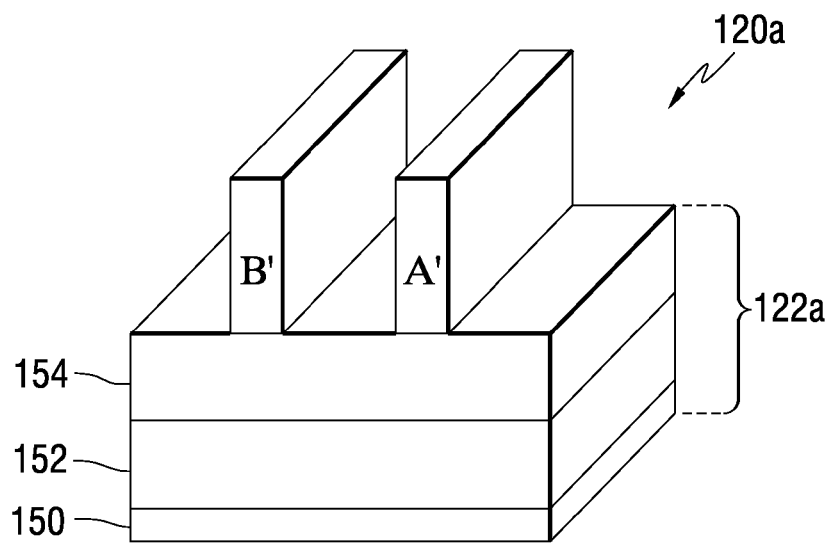
FIGS. 7a-7c illustrate utilizing a block copolymer template and lithographic patterning to form a device, according to one aspect of the invention.
Figure 7B:
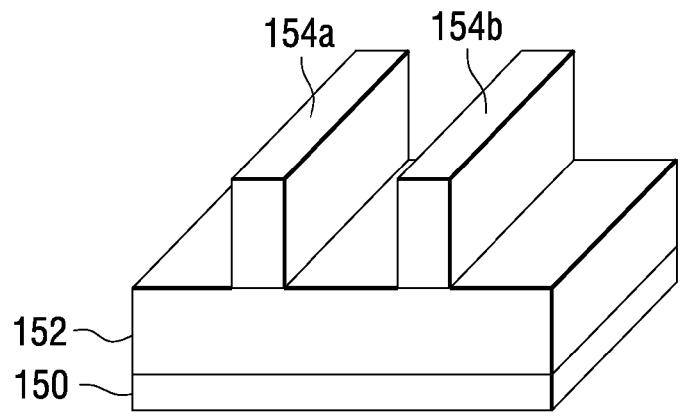
Figure 7C:
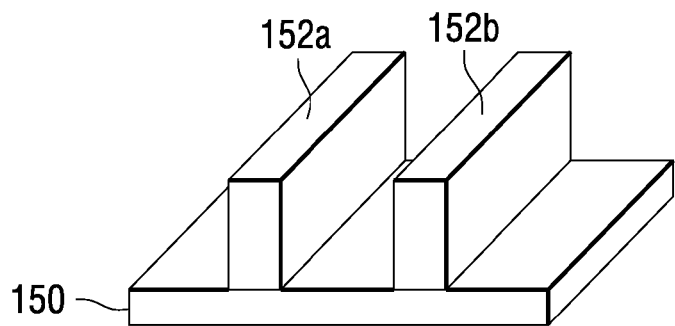

FIGS. 7a-7c illustrate utilizing a block copolymer template and lithographic patterning to form a device, in accordance with an aspect of the invention. Specifically, FIG. 7a illustrates a block copolymer template 120a formed on a multilayer substrate 122. The substrate 122a includes a substrate layer 150, a magnetic layer 152 and a hard mask layer 154 formed of, for example, a metal and/or an oxide material. The template 120a is formed in a similar manner as the template 20a shown in FIG. 2. FIG. 7b illustrates a pattern transfer operation from the component blocks A' and B' to the hard mask layer 154 utilizing, for example, reactive ion etching (RIE), which results in the formation of mask layer blocks 154a and 154b. FIG. 7c illustrates an additional pattern transfer operation from the mask layer blocks 154a and 154b to the magnetic layer 152 utilizing, for example, RIE, which results in the formation of magnetic blocks 152a and 152b. The resulting device shown in FIG. 7c may be, for example, a data storage media wherein the magnetic blocks 152a and 152b are configured as magnetic recording tracks. The data storage media and corresponding recording tracks may be, for example, a discrete track media (DTM).

Figure 8A:
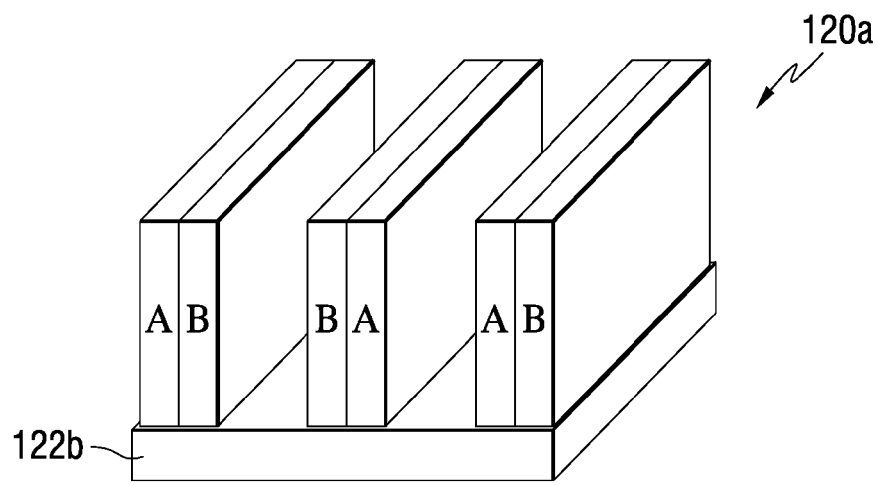
FIGS. 8a-8c illustrate utilizing a block copolymer template and lithographic patterning to form a device, according to one aspect of the invention.
Figure 8B:
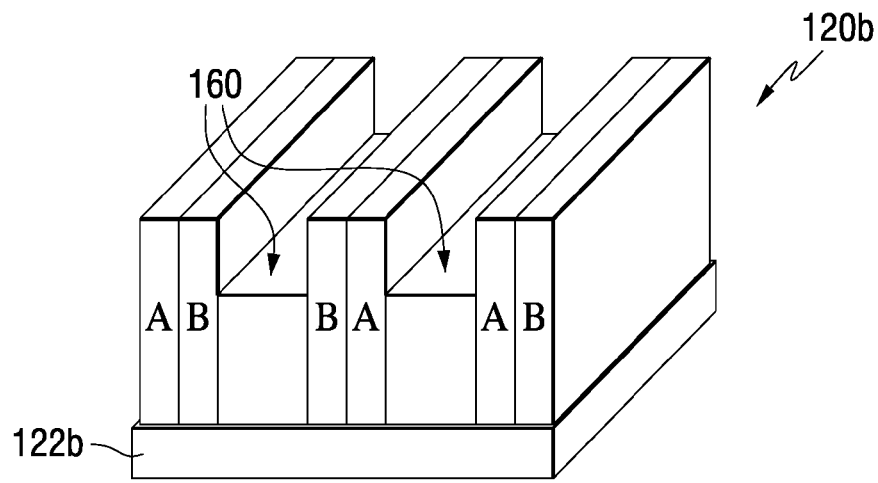
Figure 8C:
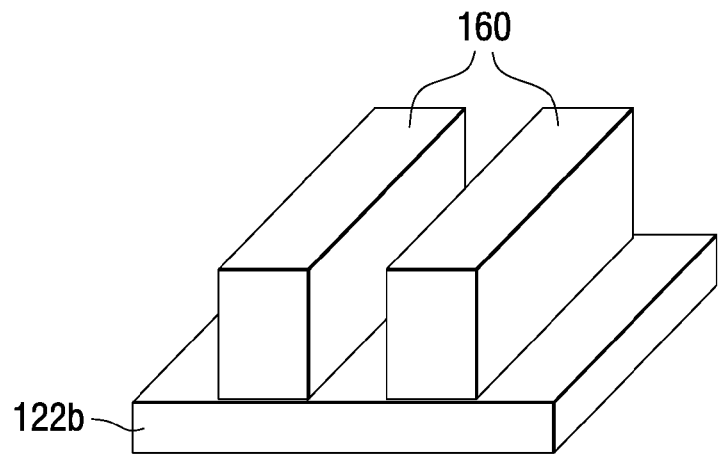

FIGS. 8a-8c illustrate utilizing a block copolymer template and lithographic patterning to form a device, in accordance with an aspect of the invention. Specifically, FIG. 8a illustrates a block copolymer template 120b formed on a substrate 122b. The template 120b is formed in a similar manner as the template 20b shown in FIG. 3. FIG. 8b illustrates depositing blocks of magnetic material 160 between the copolymer blocks AB-BA and BA-AB. The deposition may be, for example, an electroplating deposition process. FIG. 8c illustrates a device that includes magnetic blocks 160 which remain following removal of the copolymer blocks AB, BA and AB by, for example a stripping process. The resulting device shown in FIG. 8c may be, for example, a data storage media wherein the magnetic blocks 160 are configured as magnetic recording tracks. The data storage media and corresponding recording tracks may be, for example, a discrete track media (DTM).

While FIGS. 7a-7c and 8a-8c illustrate a copolymer block template having lamellae shaped blocks, it will be appreciated that a copolymer block template having other shapes, e.g. cylinder shaped blocks such as illustrated in FIG. 6, may be utilized in accordance with the invention. For example, a copolymer block template having cylindrical shaped blocks could be utilized to form a data storage media having a plurality of individual magnetic islands or domains, e.g. a bit patterned media (BPM).

The implementation described above and other implementations are within the scope of the following claims.

What is claimed is:

1. A method comprising:
   depositing a block copolymer structure on a substrate, said block copolymer structure having a plurality of blocks of a first polymer and a plurality of blocks of a second polymer, said blocks of said first polymer and said second polymer being chemically different and arranged such that blocks of the first polymer are adjacent to each other and blocks of the second polymer are adjacent to each other, and said block copolymer structure also having a first component deposited between adjacent blocks of said first polymer and a second component deposited between adjacent blocks of said second polymer;
   developing a template by removing either said first and second polymers or said first and second components from said block copolymer structure; and
   lithographically patterning a device utilizing said template.

2. The method of claim 1, wherein said first polymer comprises one of: polystyrene, polymethylmethacrylate, polyethyleneoxide, polyisoprene, polybutadiene, polylactide, or polyvinylpyridine.

3. The method of claim 1, wherein said second polymer comprises one of: polystyrene, polymethylmethacrylate, polyethyleneoxide, polyisoprene, polybutadiene, polylactide, or polyvinylpyridine.

4. The method of claim 1, wherein said first component comprises an organosilicate.

5. The method of claim 1, wherein said first component comprises one of: a diblock copolymer structure having two layers of a first material between two layers of a second material or a triblock copolymer structure having a layer of a first material between two layers of a second material.

6. The method of claim 1, wherein said first component comprises one of:
   polystyrene-b-polydimethylsiloxane, polystyrene-b-polydimethylsiloxane, polyethyleneoxide-b-polydimethylsiloxane, polystyrene-b-polydimethylsiloxane-b-polystyrene, polymethylmethacrylate-b-polydimethylsiloxane-b-polymethylmethacrylate, or polyethyleneoxide-b-polydimethylsiloxane-polyethyleneoxide.

7. The method of claim 1, wherein said second component comprises one of: a homopolymer, a block copolymer or an organosilicate.

8. The method of claim 7, wherein said block copolymer comprises one of: a diblock copolymer structure or a triblock copolymer structure.

9. The method of claim 7, wherein said second component comprises on of:
   polyethyleneoxide, polyisoprene, polybutadiene, polylactide, polyvinylpyridine, polystyrene-b-polydimethylsiloxane, polystyrene-b-polydimethylsiloxane, polyethyleneoxide-b-polydimethylsiloxane, polystyrene-b-polydimethylsiloxane-b-polystyrene, polymethylmethacrylate-b-polydimethylsiloxane-b-polymethylmethacrylate, polyethyleneoxide-b-polydimethylsiloxane-polyethyleneoxide, or a hybrid di-/triblock copolymers.

10. The method of claim 1, wherein said block copolymer structure has a cylinder or lamellae shape.

11. The method of claim 1, wherein said template has a domain period in the range of about 5 nm to about 200 nm.

12. The method of claim 1, wherein the lithographically patterning a device includes depositing a magnetic material on said template.

13. A method comprising:
   forming a block copolymer structure on a substrate, said block copolymer structure having a plurality of first polymer blocks, a plurality of second polymer blocks, said blocks of said first polymer and said second polymer being chemically different and arranged such that blocks of the first polymer are adjacent to each other and blocks of the second polymer are adjacent to each other, and a first magnetic component, and a second magnetic component, wherein said first magnetic component is positioned between adjacent said first polymer blocks and said second magnetic component is positioned between adjacent said second polymer blocks; and
   removing said pluralities of first and second polymer blocks to form a device.

14. The method of claim 13, wherein said device is a data storage medium.

15. The method of claim 13, wherein said device has a domain period in the range of about 5 nm to about 200 nm.

16. The method of claim 13, wherein said block copolymer comprises one of: a diblock copolymer structure or a triblock copolymer structure.

17. The method of claim 1, wherein the template has a domain period in a range from about 5 nm to about 200 nm.

18. The method of claim 1, wherein the first component has a thickness in a range from about 1 nm to about 50 nm, and the second component has a thickness in a range from about 1 nm to about 50 nm.

* * * * *